(12) United States Patent
Zhang et al.

(10) Patent No.: US 11,800,735 B2
(45) Date of Patent: Oct. 24, 2023

(54) FLEXIBLE DISPLAY MODULE AND MANUFACTURING METHOD THEREOF, AND FLEXIBLE DISPLAY APPARATUS

(71) Applicant: BOE TECHNOLOGY GROUP CO., LTD., Beijing (CN)

(72) Inventors: Jiahao Zhang, Beijing (CN); Paoming Tsai, Beijing (CN); Hong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 472 days.

(21) Appl. No.: 17/059,505

(22) PCT Filed: Mar. 18, 2020

(86) PCT No.: PCT/CN2020/079969
§ 371 (c)(1),
(2) Date: Nov. 30, 2020

(87) PCT Pub. No.: WO2020/211588
PCT Pub. Date: Oct. 22, 2020

(65) Prior Publication Data
US 2021/0234120 A1     Jul. 29, 2021

(30) Foreign Application Priority Data

Apr. 18, 2019 (CN) .......................... 201910314301.4

(51) Int. Cl.
*H10K 50/84* (2023.01)
*H10K 71/00* (2023.01)
(Continued)

(52) U.S. Cl.
CPC ............. *H10K 50/84* (2023.02); *H10K 71/00* (2023.02); *H10K 50/844* (2023.02); *H10K 59/12* (2023.02);
(Continued)

(58) Field of Classification Search
None
See application file for complete search history.

(56) References Cited

U.S. PATENT DOCUMENTS

| 9,760,129 B2 | 9/2017 | Kim et al. |
| 2014/0002975 A1 | 1/2014 | Lee et al. |

(Continued)

FOREIGN PATENT DOCUMENTS

| CN | 106154675 | 11/2016 |
| CN | 106973549 | 7/2017 |

(Continued)

OTHER PUBLICATIONS

PCT International Search Report (w/ English translation) for corresponding PCT Application No. PCT/CN2020/079969, dated Jun. 11, 2020, 6 pages.

(Continued)

*Primary Examiner* — J. E. Schoenholtz
(74) *Attorney, Agent, or Firm* — Dority & Manning, P.A.

(57) ABSTRACT

A flexible display module includes a back film, and a flexible display screen and a protective cover plate that are sequentially stacked on a side of the back film. The protective cover plate includes a cover plate body and at least one arc-shaped extension portion. An end of an arc-shaped extension portion is connected to a side face of the cover plate body. An end of the arc-shaped extension portion away from the cover plate body extends beyond an edge of the flexible display screen and an edge of the back film. An arc-shaped concave surface of the arc-shaped extension portion faces a side face of the flexible display screen and a side face of the back film that are proximate to the arc-shaped extension portion.

14 Claims, 7 Drawing Sheets

(51) Int. Cl.
*H10K 50/844* (2023.01)
*H10K 59/12* (2023.01)
*H10K 77/10* (2023.01)
*H10K 102/00* (2023.01)

(52) U.S. Cl.
CPC ...... *H10K 77/111* (2023.02); *H10K 2102/311* (2023.02)

(56) References Cited

U.S. PATENT DOCUMENTS

| | | | |
|---|---|---|---|
| 2014/0295150 A1* | 10/2014 | Bower .................... | B32B 25/20 428/411.1 |
| 2014/0345791 A1* | 11/2014 | Son ......................... | B32B 38/18 156/581 |
| 2015/0060933 A1* | 3/2015 | Ohno ...................... | B65H 3/48 29/721 |
| 2018/0150111 A1 | 5/2018 | Kim et al. | |
| 2018/0259805 A1 | 9/2018 | Takchara | |
| 2019/0081255 A1* | 3/2019 | Kim ......................... | B32B 3/04 |
| 2020/0154581 A1 | 5/2020 | Chen | |
| 2020/0167025 A1 | 5/2020 | Xiao | |
| 2020/0287156 A1* | 9/2020 | Baby ...................... | H10K 50/84 |
| 2022/0173178 A1* | 6/2022 | Kanehiro ............. | H10K 59/122 |
| 2022/0216452 A1* | 7/2022 | Kuon ..................... | H10K 71/00 |

FOREIGN PATENT DOCUMENTS

| | | |
|---|---|---|
| CN | 107978623 | 5/2018 |
| CN | 109375810 | 2/2019 |
| CN | 208607626 | 3/2019 |
| CN | 110010013 | 7/2019 |
| KR | 20140148176 | 12/2014 |

OTHER PUBLICATIONS

Chinese First Office Action (w/ English translation) for corresponding CN Application No. 201910314301.4, 22 pages.
Chinese Supplementary Search for corresponding CN Application No. 201910314301.4, 2 pages.

* cited by examiner

```
┌─────────────────────────────────────────────────────────┐
│ The protective cover plate is manufactured. The         │
│ protective cover plate includes the cover body plate    │
│ and the arc-shaped extension portion(s), and the end    │─── S1
│ of an arc-shaped extension portion is connected to      │
│ the side face of the cover plate body                   │
└─────────────────────────────────────────────────────────┘
                             │
                             ▼
┌─────────────────────────────────────────────────────────┐
│ The protective cover plate, the flexible display screen │
│ and the back film are attached together, so that the    │
│ protective cover plate is attached to a surface of the  │
│ flexible display screen, and the back film is attached  │
│ to another surface of the flexible display screen. The  │
│ end of the arc-shaped extension portion away from the   │─── S2
│ cover plate body extends beyond the edge of the         │
│ flexible display screen and the edge of the back film.  │
│ The arc-shaped concave surface of the arc-shaped        │
│ extension portion faces the side face of the flexible   │
│ display screen and the side face of the back film that  │
│ are proximate to the arc-shaped extension portion       │
└─────────────────────────────────────────────────────────┘
```

FIG. 15

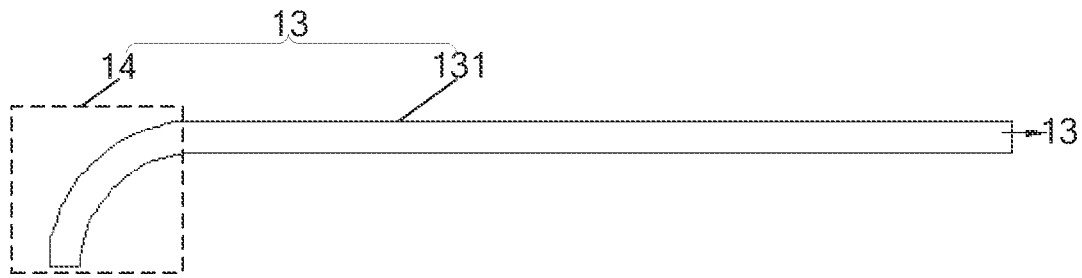

FIG. 16

S1 — The protective cover plate is manufactured. The protective cover plate includes the cover body plate and the arc-shaped extension portion(s), and the end of an arc-shaped extension portion is connected to the side face of the cover plate body S2 — The protective cover plate, the flexible display screen and the back film are attached together, so that the protective cover plate is attached to a surface of the flexible display screen, and the back film is attached to another surface of the flexible display screen. The end of the arc-shaped extension portion away from the cover plate body extends beyond the edge of the flexible display screen and the edge of the back film. The arc-shaped concave surface of the arc-shaped extension portion faces the side face of the flexible display screen and the side face of the back film that are proximate to the arc-shaped extension portion S31 — The gap between the arc-shaped concave surface of the arc-shaped extension portion and the side faces of the flexible display screen and the back film that are proximate to the arc-shaped extension portion is filled with the elastic material, by using an adhesive dispensing process S32 — The elastic material is cured

FIG. 17

FLEXIBLE DISPLAY MODULE AND MANUFACTURING METHOD THEREOF, AND FLEXIBLE DISPLAY APPARATUS

CROSS-REFERENCE TO RELATED APPLICATIONS

This application is a national phase entry under 35 USC 371 of International Patent Application No. PCT/CN2020/079969 filed on Mar. 18, 2020, which claims priority to Chinese Patent Application No. 201910314301.4, filed on Apr. 18, 2019, titled "A FLEXIBLE DISPLAY MODULE AND MANUFACTURING METHOD THEREOF", which are incorporated herein by reference in their entirety.

TECHNICAL FIELD

The present disclosure relates to the field of display technologies, and in particular, to a flexible display module and a manufacturing method thereof, and a flexible display apparatus.

BACKGROUND

At present, with the increase of people's demand for diversification of display products, flexible display modules have attracted more and more attention due to their deformable and bendable characteristics.

SUMMARY

In an aspect, a flexible display module is provided. The flexible display module includes a back film, and a flexible display screen and a protective cover plate that are sequentially stacked on a side of the back film. The protective cover plate includes a cover plate body and at least one arc-shaped extension portion. An end of an arc-shaped extension portion is connected to a side face of the cover plate body. An end of the arc-shaped extension portion away from the cover plate body extends beyond an edge of the flexible display screen and an edge of the back film. An arc-shaped concave surface of the arc-shaped extension portion faces a side face of the flexible display screen and a side face of the back film that are proximate to the arc-shaped extension portion.

In some embodiments, the end of the arc-shaped extension portion away from the cover plate body is a free end.

In some embodiments, an end face of the free end and a surface of the back film away from the flexible display screen are in a same plane.

In some embodiments, the arc-shaped concave surface of the arc-shaped extension portion and the side faces of the flexible display screen and the back film that are proximate to the arc-shaped extension portion have a gap therebetween.

In some embodiments, the flexible display module further includes an elastic material, and the gap is filled with the elastic material.

In some embodiments, an elastic modulus of the elastic material is less than an elastic modulus of the back film.

In some embodiments, the elastic modulus of the back film is in a range from 3 GPa to 4 GPa, and the elastic modulus of the elastic material is in a range from 40 KPa to 50 KPa.

In some embodiments, the elastic material is silica gel or Tuffy glue.

In some embodiments, a material of the back film is polyethylene terephthalate or acrylic resin.

In some embodiments, the cover plate body is integrally shaped with the at least one arc-shaped extension portion. Or, an end face of the end of the arc-shaped extension portion proximate to the cover plate body is bonded to the side face of the cover plate body proximate to the arc-shaped extension portion.

In some embodiments, the arc-shaped extension portion is a strip extending along a side of the cover plate body proximate to the arc-shaped extension portion, and a length of the strip is equal to or approximately equal to a length of the side of the cover plate body proximate to the arc-shaped extension portion. The length of the strip and the length of the side are in a same direction. Or, the at least one arc-shaped extension portion includes a plurality of arc-shaped extension portions, and the plurality of arc-shaped extension portions are spaced apart and arranged in a sequence along a side of the cover plate body proximate to the arc-shaped extension portions.

In some embodiments, a thickness of the arc-shaped extension portion is less than or equal to a thickness of the cover plate body.

In some embodiments, the flexible display screen includes a flexible base, and transistors, light-emitting devices and an encapsulation layer that are disposed on the flexible base. A surface of the flexible base away from the encapsulation layer is attached to the back film, and a surface of the encapsulation layer away from the flexible base is attached to the protective cover plate.

In another aspect, a manufacturing method of a flexible display module is provided. The manufacturing method includes: manufacturing a protective cover plate; the protective cover plate including a cover plate body and at least one arc-shaped extension portion, and an end of an arc-shaped extension portion being connected to a side face of the cover plate body; and attaching the protective cover plate, a flexible display screen and a back film together, so that the protective cover plate is attached to a surface of the flexible display screen, and the back film is attached to another surface of the flexible display screen, an end of the arc-shaped extension portion away from the cover plate body extending beyond an edge of the flexible display screen and an edge of the back film, and an arc-shaped concave surface of the arc-shaped extension portion facing a side face of the flexible display screen and a side face of the back film that are proximate to the arc-shaped extension portion.

In some embodiments, manufacturing the protective cover plate, includes: performing a hot bending treatment on a flat-plate-shaped protective cover plate base, so that a side of the protective cover plate base is formed into the at least one arc-shaped extension portion; and performing a cooling treatment on the protective cover plate base with the at least one arc-shaped extension portion formed to obtain the protective cover plate.

In some embodiments, the arc-shaped concave surface of the arc-shaped extension portion and the side faces of the flexible display screen and the back film that are proximate to the arc-shaped extension portion have a gap therebetween. The manufacturing method further includes: filling the gap with an elastic material, by using an adhesive dispensing process; and curing the elastic material.

In yet another aspect, a flexible display apparatus is provided. The flexible display apparatus includes the flexible display module according to any one of the above embodiments.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, an actual process of a method and actual timings of signals that the embodiments of the present disclosure relate to.

FIG. 15 is a flow diagram of a method for manufacturing a flexible display module, in accordance with some embodiments of the present disclosure;

FIG. 16 is a diagram showing a structure of a protective cover plate, in accordance with some embodiments of the present disclosure; and FIG. 17 is a flow diagram of a method for manufacturing another flexible display module, in accordance with some embodiments of the present disclosure.

DETAILED DESCRIPTION

Technical solutions in some embodiments of the present disclosure will be described below clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description, the terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

In the description of some embodiments, orientations or positional relationships indicated by the terms such as "upper", "lower", "vertical", "horizontal", "top", "bottom", "inner" and "outer" are on a basis of orientations or positional relationships shown in the accompanying drawings. They are merely to facilitate and simplify the description of the present disclosure, but is not to indicate or imply that the referred devices or elements must have a particular orientation, or must be constructed or operated in a particular orientation. Therefore, they cannot be construed as limitations on the present disclosure.

The phrase "A and/or B" includes the following three combinations: only A, only B, and a combination of A and B.

Figure 1:
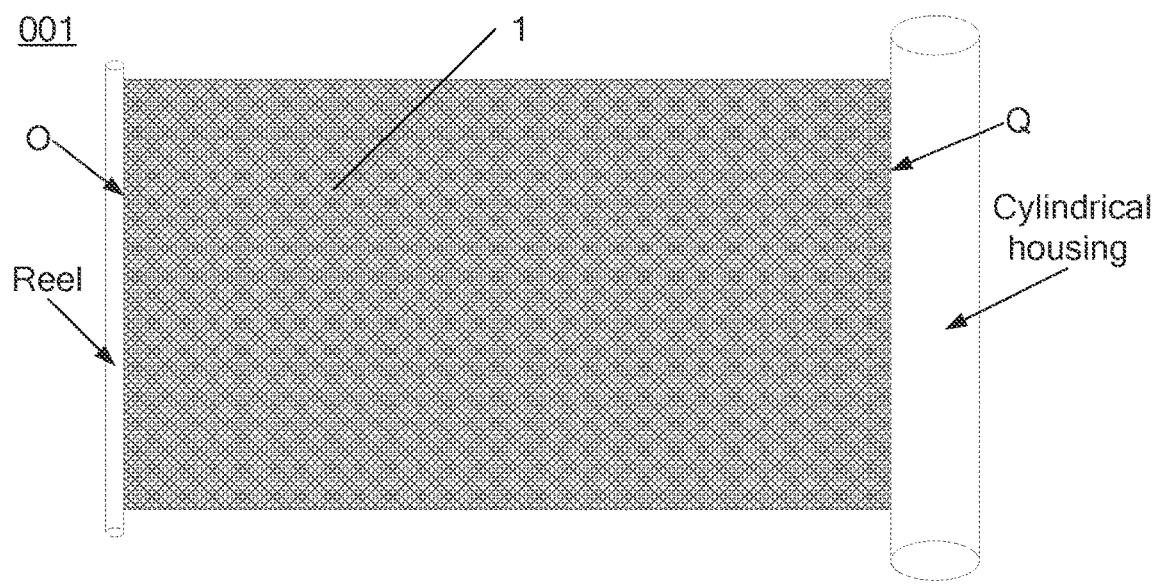
FIG. 1 is a diagram showing a structure of a flexible display apparatus, in accordance with some embodiments of the present disclosure.

As shown in FIG. 1, embodiments of the present disclosure provide a flexible display apparatus 001. The flexible display apparatus 001 may be a display apparatus with a display function such as a mobile phone, a tablet computer, or an image screen. The flexible display apparatus 001 includes a flexible display module 1, and the flexible display module 1 has a free end O and a fixed end Q. The flexible display apparatus 001 further includes a reel and a cylindrical housing. The free end O of the flexible display module 1 is disposed on the reel, and the fixed end Q of the flexible display module 1 is disposed in the cylindrical housing. In a case where no display is needed, the flexible display module 1 may be rolled on the reel by rolling the reel, and then the flexible display module 1 rolled on the reel is placed in the cylindrical housing. In a case where the display is needed, the reel is taken out of the cylindrical housing, and the flexible display module 1 rolled on the reel is unrolled by rolling the reel.

Figure 2:
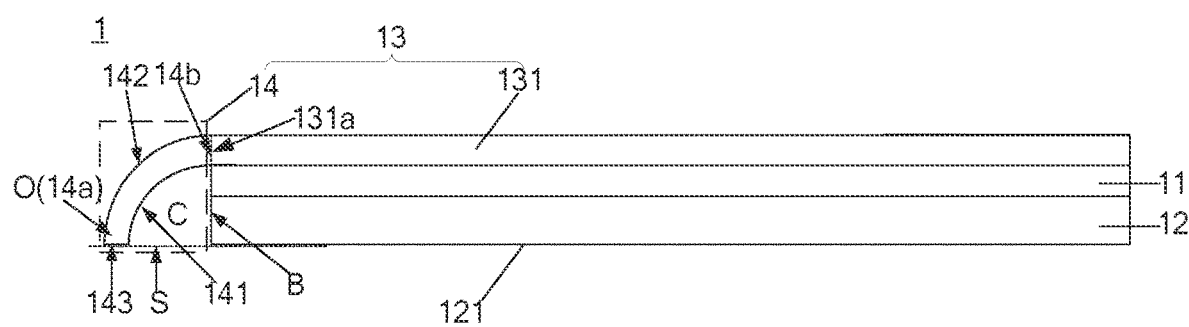
FIG. 2 is a sectional view of a flexible display module, in accordance with some embodiments of the present disclosure.

As shown in FIG. 2, the embodiments of the present disclosure provide a flexible display module 1 applied to the flexible display apparatus 001. The flexible display module 1 includes a back film 12, and a flexible display screen 11 and a protective cover plate 13 that are sequentially stacked on a side of the back film 12.

Figure 3:
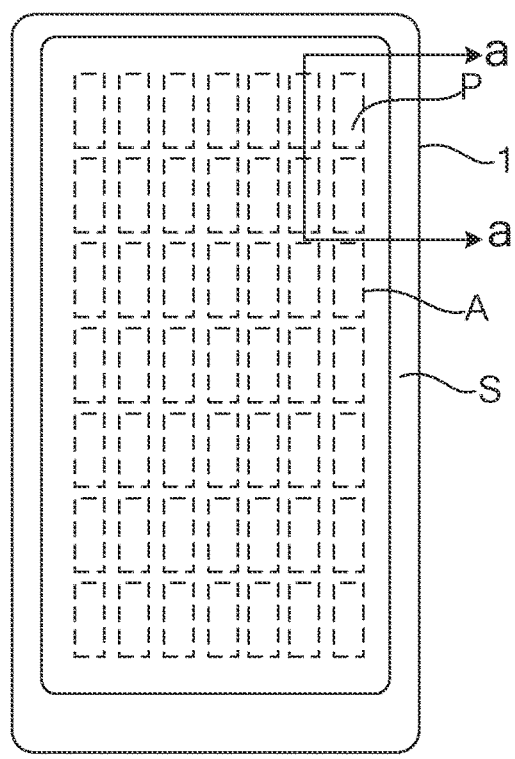
FIG. 3 is a top view of a flexible display module, in accordance with some embodiments of the present disclosure.

In some embodiments, as shown in FIG. 3, the flexible display screen 11 may be divided into a display area (i.e., active area, AA) A and a peripheral area S located around the display area A. The peripheral area S is used for wiring, and may further be used for placing a driver circuit (e.g., a gate driver circuit). The display area A is provided with a plurality of sub-pixels P.

For example, the flexible display screen 11 is an electroluminescent display screen or a photoluminescent display screen. The electroluminescent display screen may be an organic light-emitting diode (OLED) display screen or a quantum dot light-emitting diode (QLED) display screen. The photoluminescent display screen may be a quantum dot photoluminescent display screen.

Figure 4:
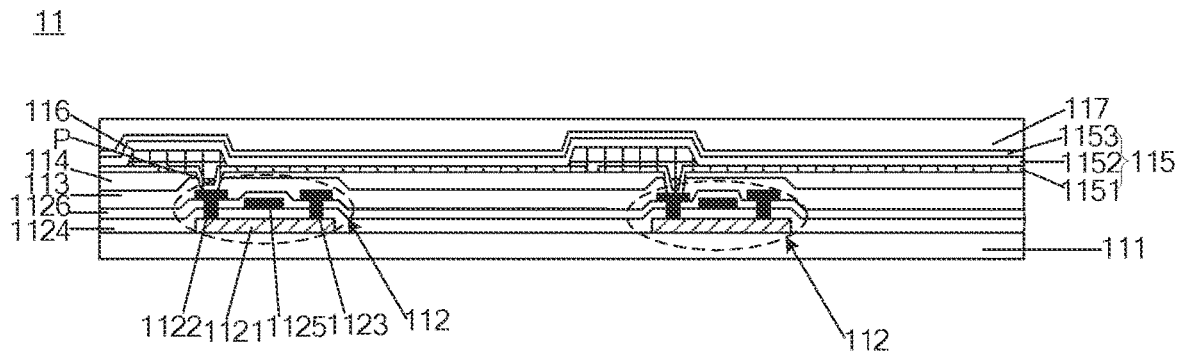
FIG. 4 is a sectional view of a flexible display screen, in accordance with some embodiments of the present disclosure.

As shown in FIG. 4, the flexible display screen 11 includes a flexible base 111 made of a flexible material, pixel driver circuits disposed on the flexible base 111 and located in regions of the sub-pixels P, and light-emitting devices 115. A pixel driver circuit includes a plurality of transistors. One of the plurality of transistors is a driving transistor 112, and a drain 1122 of the driving transistor 112 is electrically connected to an anode 1151 of a light-emitting device 115.

As shown in FIG. 4, the driving transistor 112 further includes a semiconductor layer 1121, a gate insulating layer 1124, a gate 1125, an interlayer insulating layer 1126 and a source 1123 that are sequentially stacked on the flexible base 111. The source 1123 and the drain 1122 are disposed in a same layer.

As shown in FIG. 4, the flexible display screen 11 further includes a pixel defining layer 116. The pixel defining layer 116 includes a plurality of opening regions, and a light-emitting device 115 is disposed in an opening region.

The light-emitting device 115 may further include a light-emitting functional layer 1152 and a cathode 1153. In some embodiments, the light-emitting functional layer 1152 includes a light-emitting layer. In some other embodiments, in addition to the light-emitting layer, the light-emitting functional layer 1152 further includes one or more of an electron transport layer (ETL), an electron injection layer (EIL), a hole transport layer (HTL) and a hole injection layer (HIL).

Taking an example in which the flexible display screen 11 is the electroluminescent display screen, the light-emitting device 115 may be a top emission type light-emitting device. In this case; the anode 1151 is opaque, and may be, for example, in a stacked structure of indium tin oxide (ITO), silver (Ag) and ITO; and the cathode 1153 is transparent or translucent, and may be made of, for example, silver with a small thickness.

In addition, the flexible display screen 11 may further include, for example, a passivation layer 113 and a planarization layer 114 that are disposed between the driving transistor 112 and the anode 1151.

On a basis of the above structure, the flexible display screen 11 may further include an encapsulation layer for encapsulating the light-emitting device 115. The encapsulation layer 117 may be an encapsulation thin film or an encapsulation substrate.

Figure 5:
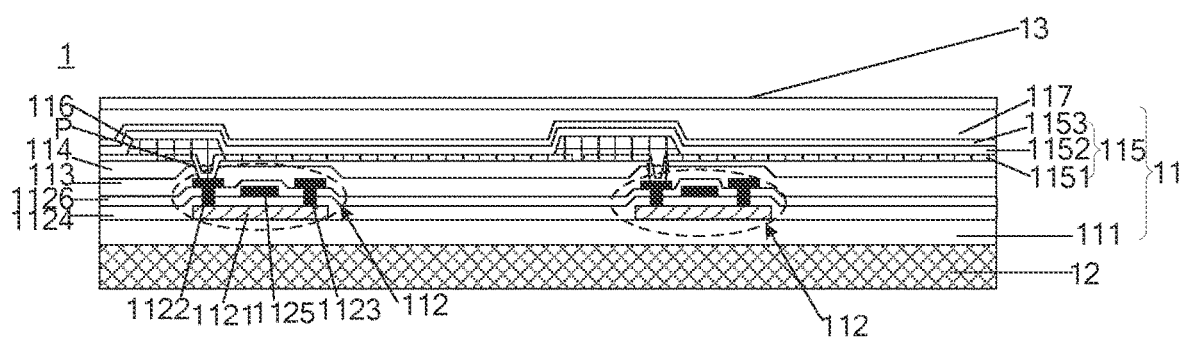
FIG. 5 is a sectional view of another flexible display module, in accordance with some embodiments of the present disclosure.
Figure 7:
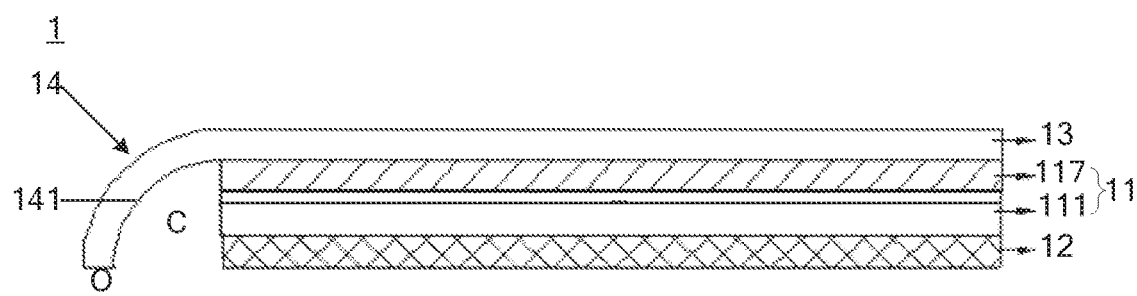
FIG. 7 is a sectional view of yet another flexible display module, in accordance with some embodiments of the present disclosure.

In some embodiments, referring to FIGS. 5 and 7, the back film 12 is disposed on a side of the flexible base 111 in the flexible display screen 11 that is away from the light-emitting device 115. That is, the back film 12 is attached to a back side of the flexible base 111 in the flexible display screen 11. The back film 12 is used for preventing external impurities from entering the flexible display screen 11 and supporting the flexible display screen 11.

For example, the back film 12 directly contacts a surface of the flexible base 111 away from the light-emitting device 115, it is beneficial to improving rollability of the flexible display module.

For example, the back film 12 is attached to the surface of the flexible base 111 away from the light-emitting device 115 through an optical adhesive with a small elastic modulus (e.g., an acrylic material or a silica gel material with an elastic modulus of 30 KPa to 40 KPa).

In some embodiments, a material of the back film 12 is polyethylene terephthalate (PET) or acrylic resin. In a case where the back film 12 is made of the PET or the acrylic resin, since an elastic modulus of the PET and an elastic modulus of the acrylic resin are small, it is beneficial to improving the rollability of the flexible display module 1.

In some embodiments, a thickness of the back film 12 may be in a range from 0.08 mm to 0.15 mm. For example, the thickness of the back film 12 may be 0.08 mm, 0.1 mm, 0.12 mm, or 0.15 mm.

In some embodiments, referring to FIGS. 5 and 7, the protective cover plate 13 is disposed on a side of the flexible display screen 11 away from the back film 12. The protective cover plate 13 is used for preventing impurities from entering the flexible display screen 11, and is resistant to falling and impact, and plays a protective role.

It will be noted that, since only a part of the protective cover plate 13 is shown in FIG. 5 and an overall structure of the protective cover plate 13 is shown in FIG. 7, a shape of the protective cover plate 13 shown in FIG. 5 is different from a shape of the protective cover plate 13 shown in FIG. 7.

For example, as shown in FIGS. 5 and 7, the protective cover plate 13 is attached to a surface of the encapsulation layer 117 in the flexible display screen 11 that is away from the flexible base 111.

For example, the protective cover plate 13 is attached to a surface of the flexible display screen 11 away from the back film 12 through an optical adhesive with a small elastic modulus (e.g., the acrylic material or the silica gel material with the elastic modulus of 30 KPa to 40 KPa). It is beneficial to improving the rollability of the flexible display module 11, and enables the flexible display module 11 to have falling resistance and impact resistance.

In some embodiments, the protective cover plate 13 has a single-layer structure composed of a polyimide thin film or ultra-thin glass. In a case where the protective cover plate 13 has the single-layer structure composed of the polyimide thin film or the ultra-thin glass, since an elastic modulus of the single-layer structure composed of the polyimide thin film or the ultra-thin glass is small, it is beneficial to improving the rollability of the flexible display module 1.

Figure 6:
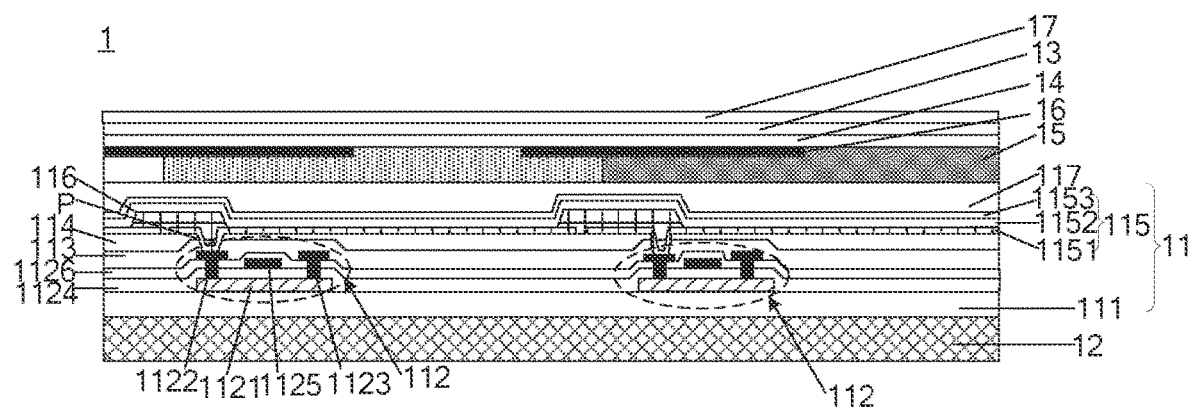
FIG. 6 is a sectional view of yet another flexible display module, in accordance with some embodiments of the present disclosure.

On the above basis, in some embodiments, as shown in FIG. 6, a touch structure 14 may be disposed between the flexible display screen 11 and the protective cover plate 13. Through the touch structure 14, recognition of a touch position by the flexible display module 11 may be achieved, and user experience may be improved.

Of course, in some other embodiments, the touch structure may further be integrated in the flexible display screen 11. That is, the touch structure is disposed between the flexible base 111 and the encapsulation layer 117 in the flexible display screen 11. For example, the touch structure includes a plurality of touch electrodes, and a touch electrode further serves as the cathode 1153 in the flexible display screen 11.

In order to apply the flexible display module 1 in some embodiments of the present disclosure to a large-sized flexible display apparatus, in some embodiments, as shown in FIG. 6, a color filter layer 15 and a black matrix 16 are disposed between the flexible display screen 11 and the protective cover plate 13. In this case, the light-emitting device 115 is capable of emitting white light. The color filter layer 15 may include filter portions of a plurality of colors. The filter portions are disposed in one-to-one correspondence with the sub-pixels P and directly face the sub-pixels P. The filter portions of the plurality of colors include filter portions of a first color, filter portions of a second color and filter portions of a third color. The first color, the second color and the third color are three primary colors (e.g., red, green and blue). The black matrix 16 is used for separating any adjacent filter portions.

Of course, the flexible display module 1 provided by some embodiments of the present disclosure may not be provided with the color filter layer. In this case, a color image is displayed by light of the three primary colors emitted by the light-emitting devices 115 in the sub-pixels P.

In addition, for example, as shown in FIG. 6, a polarizing layer 17 or a phase difference plate may be disposed on a side of the protective cover plate 13 away from the flexible display screen 11.

In the embodiments of the present disclosure, referring to FIG. 2, the protective cover plate 13 includes a cover plate body 131 and arc-shaped extension portion(s) 14.

With continued reference to FIG. 2, an end 14b of an arc-shaped extension portion 14 is connected to a side face 131a of the cover plate body 131.

It will be noted that, a part of the arc-shaped extension portion 14 connected to the cover plate body 131 is smooth. That is, the cover plate body 131 and the arc-shaped extension portion 14 are tangent at a connecting position.

For example, as shown in FIG. 7, in some embodiments, the cover plate body 131 has a rectangular shape, the arc-shaped extension portion 14 has a shape of a circular arc, and the cover plate body 131 and the arc-shaped extension portion 14 are tangent at the connecting position.

In some embodiments, the cover plate body 131 is integrally shaped with the arc-shaped extension portion 14. In this way, the cover plate body 131 is not easy to break at the connecting position of the cover plate body 131 and the arc-shaped extension portion 14, thereby improving a structural reliability of the protective cover plate 13.

In some embodiments, an end face of the end of the arc-shaped extension portion 14 proximate to the cover plate body 131 is bonded to the side face of the cover plate body 131 proximate to the arc-shaped extension portion 14. That is, the cover plate body 131 and the arc-shaped extension portion 14 are separate structures, and the cover plate body 131 and the arc-shaped extension portion 14 are bonded together to form the protective cover plate 13.

Figure 8:
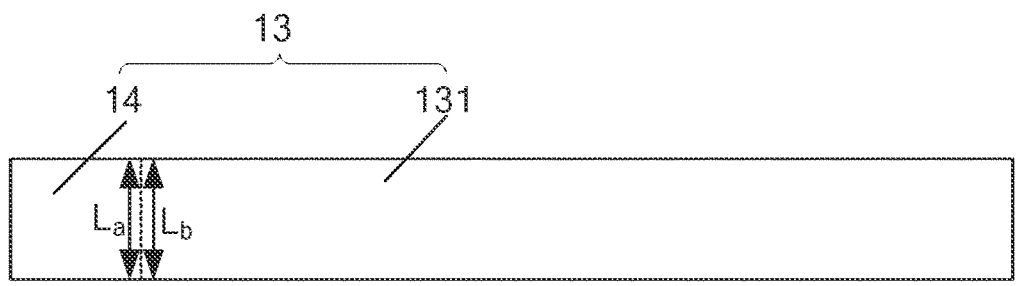
FIG. 8 is a top view of a protective cover plate, in accordance with some embodiments of the present disclosure.

In some embodiments, as shown in FIG. 8, the arc-shaped extension portion 14 is a strip extending along a side of the cover plate body 131 proximate to the arc-shaped extension portion 14, and a length $L_a$ of the strip is equal to or approximately equal to a length $L_b$ of the side of the cover plate body 131 proximate to the arc-shaped extension portion 14.

Figure 9:
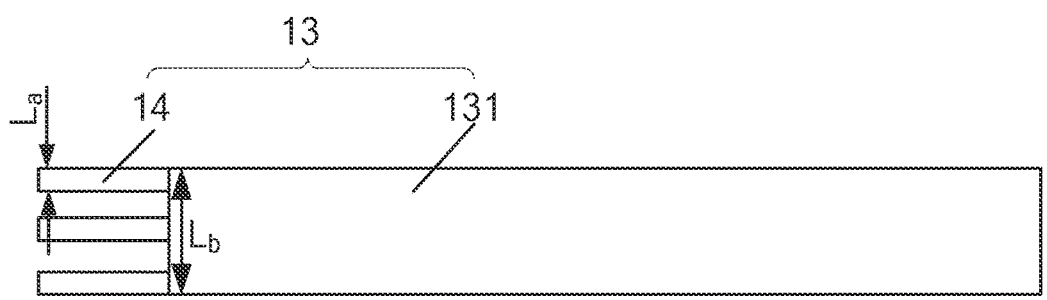
FIG. 9 is a top view of another protective cover plate, in accordance with some embodiments of the present disclosure.

In some embodiments, as shown in FIG. 9, the protective cover plate 13 includes a plurality of arc-shaped extension portions 14, and the plurality of arc-shaped extension portions 14 are spaced apart and arranged in a sequence along the side of the cover plate body 131 proximate to the arc-shaped extension portions 14.

A thickness of the arc-shaped extension portion 14 is not limited in the embodiments of the present disclosure. The thickness of the arc-shaped extension portion 14 may be less than a thickness of the cover plate body 131, or the thickness of the arc-shaped extension portion 14 may be equal to the thickness of the cover plate body 131.

For example, in a case where the cover plate body 131 is integrally shaped with the arc-shaped extension portion 14, the thickness of the arc-shaped extension portion 14 is equal to the thickness of the cover plate body 131.

For example, in a case where the cover plate body 131 and the arc-shaped extension portion 14 are separate structures, the thickness of the arc-shaped extension portion 14 is less than the thickness of the cover plate body 131.

With continued reference to FIG. 2, an end 14a of the arc-shaped extension portion 14 away from the cover plate body 131 extends beyond an edge of the flexible display screen 11 and an edge of the back film 12.

It will be noted that, the end 14a of the arc-shaped extension portion 14 away from the cover plate body 131 extending beyond the edges of the flexible display screen 11 and the back film 12 means that, an orthographic projection of the end 14a of the arc-shaped extension portion 14 away from the cover plate body 131 on a plane is located outside an edge of an orthographic projection of the flexible display screen 11 on the plane and an edge of an orthographic projection of the back film 12 on the plane. Herein, the plane is a plane where the surface of the flexible base 111 away from the light-emitting device 115 is located.

For example, in some embodiments, as shown in FIG. 7, the shape of the cover plate body 131, a shape of the flexible display screen 11, and a shape of the back film 12 are rectangles of an equal or approximately equal size, and the arc-shaped extension portion 14 extends out with respect to the edges of the flexible display screen 11 and the back film 12.

With continued reference to FIG. 2, an arc-shaped concave surface 141 of the arc-shaped extension portion 14 faces a side face of the flexible display screen 11 and a side face B of the back film 12 that are proximate to the arc-shaped extension portion 14.

It will be noted that, the arc-shaped extension portion 14 has two opposite side faces, one side face is the arc-shaped concave surface 141 and the other side face is an arc-shaped convex surface 142. The arc-shaped concave surface 141 refers to one of the two side faces of the arc-shaped extension portion 14 closer to a chord of the arc-shaped extension portion 14 (i.e., a connection line between two ends of the arc-shaped extension portion 14). The arc-shaped convex surface 142 refers to one of the two side faces of the arc-shaped extension portion 14 further away from the chord of the arc-shaped extension portion 14.

Since the arc-shaped concave surface 141 of the arc-shaped extension portion 14 faces the side faces of the flexible display screen 11 and the back film 12 that are proximate to the arc-shaped extension portion 14, a side face of the arc-shaped extension portion 14 facing away from the side faces of the flexible display screen 11 and the back film 12 that are proximate to the arc-shaped extension portion 14 is the arc-shaped convex surface 142. That is, the arc-shaped extension portion 14 protrudes in a direction away from the side faces of the flexible display screen 11 and the back film 12 that are proximate to the arc-shaped extension portion 14.

Figure 10:
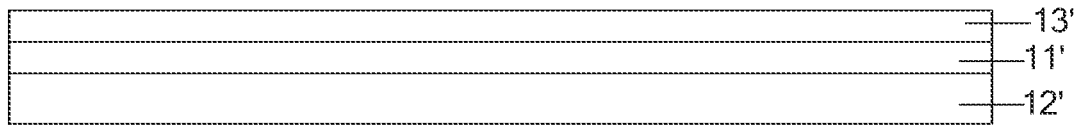
FIG. 10 is a sectional view of a flexible display module, in accordance with the related art.
Figure 11:
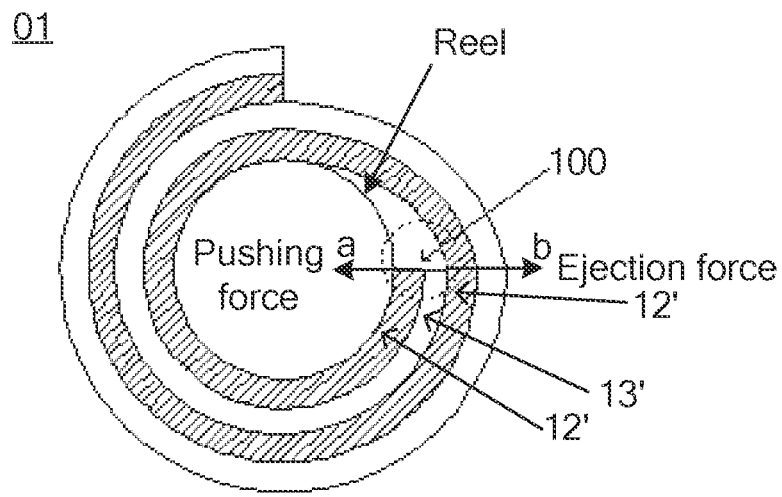
FIG. 11 is a diagram showing a structure in which the flexible display module shown in FIG. 10 is rolled on a reel.

In the related art, as shown in FIG. 10, a flexible display module 01 includes a back film 12', and a flexible display screen 11' and a protective cover plate 13' that are sequentially stacked on a side of the back film 12'. The protective cover plate 13', the flexible display screen 11' and the back film 12' are arranged in such a manner that edges of the layers are aligned or approximately aligned. As shown in FIG. 11 (the flexible display screen 11' being not shown in FIG. 11), when a side of the flexible display module 01 is rolled on a reel as a start end, since stacked layers (i.e., the protective cover plate 13', the flexible display screen 11' and the back film 12') have certain thicknesses, a space 100 is generated between a head end and a tail end of a first coil (i.e., a rolled first coil) in a rolling process.

It will be noted that, the space generated between the head end and the tail end of the first coil refers to a distance between an inner surface of the tail end of the first coil and an inner surface of the head end of the first coil, and the inner surface of the tail end of the first coil is located outside the inner surface of the head end of the first coil. It will be understood that, the greater the thicknesses of the stacked layers (i.e., the protective cover plate 13', the flexible display screen 11' and the back film 12') are, the greater the space 100 is.

For example, on a premise of ensuring that the protective cover plate 13', the flexible display screen 11' and the back film 12' can implement their functions, in a case where the thicknesses of the protective cover plate 13', the flexible display screen 11' and the back film 12' are set to be the smallest, a height of the space 100 is more than 200 micrometers.

Moreover, since a material of the protective cover plate 13' (e.g., ultra-thin glass or polyimide with an elastic modulus of 6 GPa) is harder than a material of the back film 12' (e.g., PET with an elastic modulus of 3 GPa to 4 GPa), an existence of the space 100 causes a sharp corner of the protective cover plate 13' to respectively generate an ejection force facing away from the reel (along a direction indicated by the arrow b in FIG. 11) and a pushing force facing the reel (along a direction indicated by the arrow a in FIG. 11) against a part of the back film 12' on the protective cover plate 13' and a part of the back film 12" below the protective cover plate 13', which easily causes an encapsulation layer in the flexible display screen 11' to break and causes the back film 12' to wrinkle.

In some related art, a method of increasing the thickness of the back film 12' and decreasing the thickness of the protective cover plate 13' is adopted to prevent the back film 12' from wrinkling, thereby improving rollability of the flexible display module 01. This method will deteriorate a protective function of the protective cover plate 13', and cannot fundamentally solve the above problems.

Figure 12:
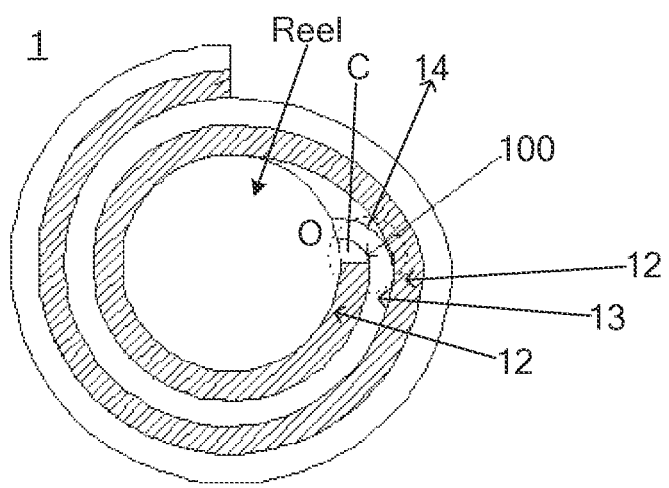
FIG. 12 is a diagram showing a structure in which the flexible display module shown in FIG. 2 is rolled on a reel.

Referring to FIGS. 2 and 12 (the flexible display screen 11 being not shown in FIG. 12), in the embodiments of the present disclosure, when the flexible display module 1 is rolled on the reel, the end of the arc-shaped extension portion 14 away from the cover plate body 131 may be fixed on the reel as a rolled start end. Due to an existence of the arc-shaped extension portion 14, in a rolling process of a second coil, the arc-shaped extension portion 14 is disposed on an inner side of the back film 12 in the second coil (i.e., a side on which the back film 12 contacts the arc-shaped extension portion 14 when the flexible display module 1 is in a rolled state). In this way, the space 100 generated between the head end and the tail end of the first coil may be filled, and adverse effects of the space 100 on the flexible display module 1 in the rolling process can be weakened.

In addition, since the back film 12 is attached to the arc-shaped convex surface 142 of the arc-shaped extension portion 14 in the rolling process of the second coil, and the end of the arc-shaped extension portion 14 away from the cover plate body 131 is shifted to the inner side of the back film 12 in the second coil, it is possible to prevent a sharp corner of the protective cover plate 13 from contacting a part of the back film 12 on the protective cover plate 13, a part of the back film 12 below the protective cover plate 13, and the flexible display screen 11 thereby preventing stress generated by the sharp corner of the protective cover plate 13 from damaging the back film 12 on and below the protective cover plate 13 and the flexible display screen 11. On this basis, the flexible display module provided by the embodiments of the present disclosure may solve the above problem that the back film is easy to wrinkle and the encapsulation layer in the flexible display screen is easy to break due to pressing of the sharp corner of the protective cover plate against the back film caused by the existence of the space.

As shown in FIG. 2, in some embodiments, the end of the arc-shaped extension portion 14 away from the cover plate body 131 is a free end O.

It will be noted that, the free end O of the arc-shaped extension portion 14 is determined according to the free end O of the flexible display module 1. As shown in FIG. 2, in some embodiments, an end face 143 of the free end O is flush with a surface 121 of the back film 12 away from the flexible display screen 11, relative to a plane S where the flexible display screen 11 is located. In a case where the end face 143 of the free end O of the arc-shaped extension portion 14 is flush with the surface 121 of the back film 12 away from the flexible display screen 11, when the flexible display module 1 is rolled on the reel, as shown in FIG. 12, the end face 143 of the free end O of the arc-shaped extension portion 14 is attached to the reel, so that the space 100 may be well compensated, and compressive stress between the back film 12 and the protective cover plate 13 may be reduced.

Figure 13:
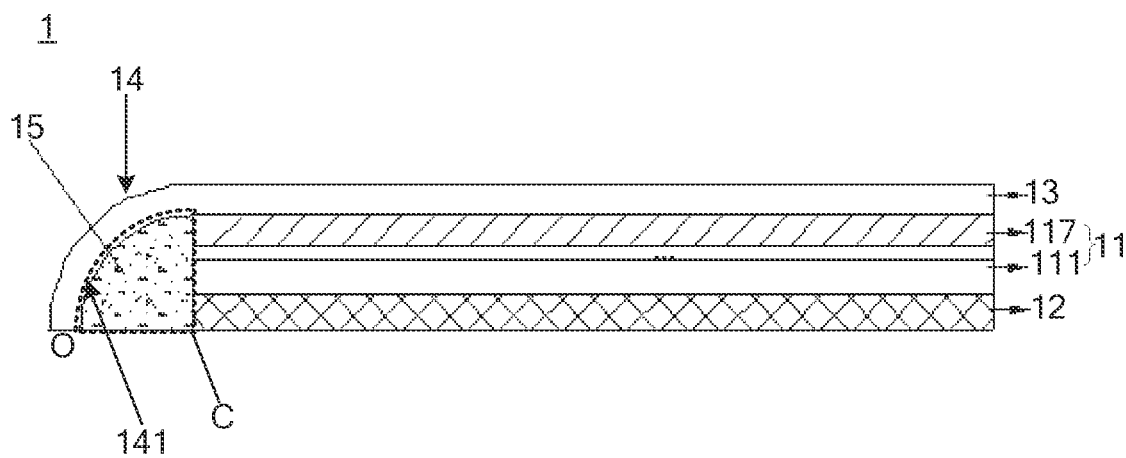
FIG. 13 is a sectional view of yet another flexible display module, in accordance with some embodiments of the present disclosure.

In some embodiments, as shown in FIG. 13, the arc-shaped concave surface 141 of the arc-shaped extension portion 14 and the side faces of the flexible display screen 11 and the back film 12 that are proximate to the arc-shaped extension portion 14 have a gap C therebetween.

Referring to FIG. 13, in some embodiments, the gap C between the arc-shaped concave surface 141 of the arc-shaped extension portion 14 and the side faces of the flexible display screen 11 and the back film 12 that are proximate to the arc-shaped extension portion 14 is filled with an elastic material 15.

For example, an elastic modulus of the elastic material 15 is less than an elastic modulus of the back film 12.

It will be noted that, an elastomer has a change in shape (referred to as "deformation") when an external force is applied to the elastomer. A general definition of the "elastic modules" is stress in a unidirectional stress state being divided by strain in that direction. In an elastic deformation stage, stress and strain of a material are in a positive proportional relationship (i.e., in accordance with Hooke's law), and a proportional coefficient is the elastic modulus in $N/m^2$. As will be seen from this definition, the greater the elastic modulus is, the greater a capability of the elastic material of resisting elastic deformation is, that is, the less likely the elastic material deforms.

Figure 14:
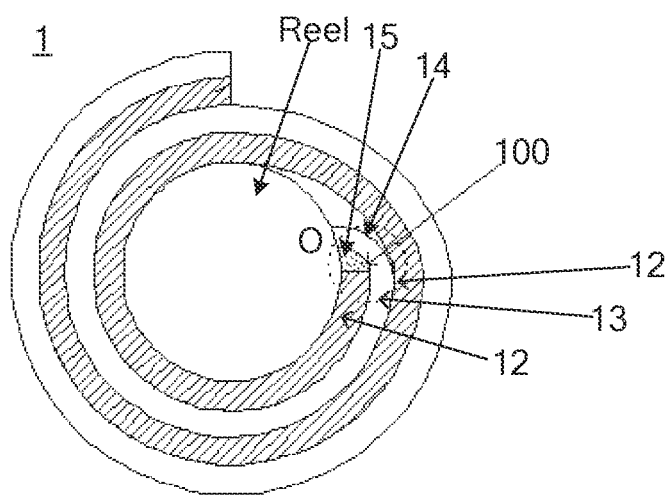
FIG. 14 is a diagram showing a structure in which the flexible display module shown in FIG. 13 is rolled on a reel.

In the embodiments of the present disclosure, the gap C between the arc-shaped concave surface 141 of the arc-shaped extension portion 14 and the side faces of the flexible display screen 11 and the back film 12 that are proximate to the arc-shaped extension portion 14 is filled with the elastic material 15. Since the elastic modulus of the elastic material 15 is less than the elastic modulus of the back film 12, that is, a material of the elastic material 15 is softer than the material of the back film 12, as shown in FIG. 14 (the flexible display screen 11 being not shown in FIG. 14), in the rolling process of the flexible display module 1, not only can the space 100 generated between the head end and the tail end of the first coil be well filled, thereby further weakening the adverse effects of the space 100 on the flexible display module 1, but also a buffering effect may be provided for the back film 12 and the flexible display screen 11, thereby preventing the back film 12 and the flexible display screen 11 from being pressed and damaged.

For example, the elastic modulus of the back film 12 is in a range from 3 Ghia to 4 GPa, and the elastic modulus of the elastic material 15 is in a range from 40 KPa to 50 KPa.

The material of the back film 12 and the elastic material 15 are not limited in the embodiments of the present disclosure, and the materials may be selected based on a standard that the elastic modulus of the elastic material 15 is less than the elastic modulus of the back film 12, For example, the material of the back film 12 is the PET or the acrylic resin, and the elastic material 15 is silica gel or Tuffy glue.

In another aspect, referring to FIG. 15, the embodiments of the present disclosure provide a manufacturing method of the flexible display module, and the manufacturing method includes the following steps.

In S1, referring to FIG. 16, the protective cover plate 13 is manufactured. The protective cover plate 13 includes the cover body plate 131 and the arc-shaped extension portion (s) 14, and the end of an arc-shaped extension portion 14 is connected to the side face of the cover plate body 131.

For example, a hot bending treatment is performed on a flat-plate-shaped protective cover plate base, so that a side of the protective cover plate base is formed into the arc-shaped extension portion(s) 14. Then, a cooling treatment is performed on the protective cover plate base with the arc-shaped extension portion(s) 14 formed to obtain the protective cover plate 13. For example, the flat-plate-shaped protective cover plate base is placed in a graphite carrier. Then, the graphite carrier is placed in a hot bending machine for hot bending, and then is preheated, pressed and cooled to obtain the protective cover plate 13.

In S2, the protective cover plate 13, the flexible display screen 11 and the back film 12 are attached together, so that the protective cover plate 13 is attached to a surface of the flexible display screen 11, and the back film 12 is attached to another surface of the flexible display screen 11. The end of the arc-shaped extension portion 14 away from the cover plate body 131 extends beyond the edge of the flexible display screen 11 and the edge of the back film 12. The arc-shaped concave surface 141 of the arc-shaped extension portion 14 faces the side face of the flexible display screen 11 and the side face of the back film 12 that are proximate to the arc-shaped extension portion 14.

For example, the flexible display screen 11 may be an OLED display screen. In a process of attaching the protective cover plate 13 to a surface of the flexible display screen 11, an upper surface 131 of the protective cover plate 13 and/or the surface of the encapsulation layer 117 in the flexible display screen 11 that is away from the flexible base 111 may be coated with an optical adhesive, so as to attach the protective cover plate 13 to the flexible display screen 11. In a process of attaching the back film 12 to another surface of the flexible display screen 11, a surface of the flexible base 111 of the flexible display screen 11 that is away from the encapsulation layer 117 and/or a surface of the back film 12 may be coated with the optical adhesive, so as to attach the flexible display screen 11 to the back film 12.

Referring to FIGS. 2 and 12, the flexible display module 1 is manufactured by using the manufacturing method of the flexible display module provided by the embodiments of the present disclosure. When the flexible display module 1 is rolled on the reel, the end of the arc-shaped extension portion 14 away from the cover plate body 131 may be fixed on the reel as the start end. Due to the existence of the arc-shaped extension portion 14, in the rolling process of the second coil, the arc-shaped extension portion 14 is disposed on the inner side of the back film 12 in the second coil (i.e., the side on which the back film 12 contacts the arc-shaped extension portion 14 when the flexible display module 1 is in the rolled state). In this way, the space 100 generated between the head end and the tail end of the first coil may be filled, and the adverse effects of the space 100 on the flexible display module 01 in the rolling process can be weakened.

In addition, since the back film 12 is attached to the arc-shaped convex surface 142 of the arc-shaped extension portion 14 in the rolling process of the second coil, and the end of the arc-shaped extension portion 14 away from the cover plate body 131 is shifted to the inner side of the back film 12 in the second coil, it is possible to prevent the sharp corner of the protective cover plate 13 from contacting the back film 12 on and below the protective cover plate 13 and the flexible display screen 11, thereby preventing the stress generated by the sharp corner of the protective cover plate 13 from damaging the part of the back film 12 on the protective cover plate 13, the part of the back film 12 below the protective cover plate 13, and the flexible display screen 11. On this basis, the flexible display module provided by the embodiments of the present disclosure may solve the above problem that the back film is easy to wrinkle and the encapsulation layer in the flexible display screen is easy to break due to pressing of the sharp corner of the protective cover plate against the back film caused by the existence of the space.

In some embodiments, as shown in FIG. 13, the arc-shaped concave surface 141 of the arc-shaped extension portion 14 and the side faces of the flexible display screen 11 and the back film 12 that are proximate to the arc-shaped extension portion 14 have the gap C therebetween. On this basis, as shown in FIG. 17, the manufacturing method of the flexible display module provided by the embodiments of the present disclosure further includes the following steps.

In S31, the gap C between the arc-shaped concave surface 141 of the arc-shaped extension portion 14 and the side faces of the flexible display screen 11 and the back film 12 that are proximate to the arc-shaped extension portion 14 is filled with the elastic material 15, by using an adhesive dispensing process.

In S32, the elastic material 15 is cured.

Herein, the adhesive dispensing is also referred to as adhesive applying, adhesive coating, adhesive potting, adhesive dripping, or the like, and refers to applying, potting, or dripping an adhesive, oil or other liquid onto a product. The elastic material may be a liquid adhesive, such as the silica gel or Tuffy glue.

For example, the silica gel or Tuffy glue is dispensed into the gap C between the arc-shaped concave surface 141 of the arc-shaped extension portion 14 and the side faces of the flexible display screen 11 and the back film 12 that are proximate to the arc-shaped extension portion 14, and the elastic material 15 may be filled in the gap C after being cured by volatilizing solvent.

In the embodiments of the present disclosure, the flexible display screen 11 may be manufactured through processes such as sputtering, deposition film, exposure, etching, and the like. As for a specific manufacturing method, reference may be made to a manufacturing method of a flexible display screen in the related art, which will not be repeated herein.

The foregoing descriptions are merely specific implementation manners of the present disclosure, but the protection scope of the present disclosure is not limited thereto. Any changes or replacements that a person skilled in the art could conceive of within the technical scope of the present disclosure shall all be included in the protection scope of the present disclosure. Therefore, the protection scope of the present disclosure shall be subject to the protection scope of the claims.

What is claimed is:

1. A flexible display module, comprising: a back film, and a flexible display screen and a protective cover plate that are sequentially stacked on a side of the back film; wherein
the protective cover plate includes:
a cover plate body; and
at least one arc-shaped extension portion; an end of an arc-shaped extension portion is connected to a side face of the cover plate body, an end of the arc-shaped extension portion away from the cover plate body extends beyond an edge of the flexible display screen and an edge of the back film, and an arc-shaped concave surface of the arc-shaped extension portion faces a side face of the flexible display screen and a side face of the back film that are proximate to the arc-shaped extension portion; and
the end of the arc-shaped extension portion away from the cover plate body is a free end, an end face of the free end and a surface of the back film away from the flexible display screen are in a same plane.

2. The flexible display module according to claim 1, wherein the arc-shaped concave surface of the arc-shaped extension portion and the side faces of the flexible display screen and the back film that are proximate to the arc-shaped extension portion have a gap therebetween.

3. The flexible display module according to claim 2, further comprising an elastic material, wherein the gap is filled with the elastic material.

4. The flexible display module according to claim 3, wherein an elastic modulus of the elastic material is less than an elastic modulus of the back film.

5. The flexible display module according to claim 4, wherein the elastic modulus of the back film is in a range from 3 GPa to 4 GPa, and the elastic modulus of the elastic material is in a range from 40 KPa to 50 KPa.

6. The flexible display module according to claim 3, the elastic material is a liquid adhesive.

7. The flexible display module according to claim 1, wherein a material of the back film is polyethylene terephthalate or acrylic resin.

8. The flexible display module according to claim 1, wherein the cover plate body is integrally shaped with the at least one arc-shaped extension portion; or
an end face of the end of the arc-shaped extension portion proximate to the cover plate body is bonded to the side face of the cover plate body proximate to the arc-shaped extension portion.

9. The flexible display module according to claim 1, wherein the arc-shaped extension portion is a strip extending along a side of the cover plate body proximate to the arc-shaped extension portion, a length of the strip is equal to or approximately equal to a length of the side of the cover plate body proximate to the arc-shaped extension portion, and the length of the strip and the length of the side are in a same direction; or
the at least one arc-shaped extension portion includes a plurality of arc-shaped extension portions, and the plurality of arc-shaped extension portions are spaced apart and arranged in a sequence along a side of the cover plate body proximate to the arc-shaped extension portions.

10. The flexible display module according to claim 1, wherein a thickness of the arc-shaped extension portion is less than or equal to a thickness of the cover plate body.

11. The flexible display module according to claim 1, wherein the flexible display screen includes: a flexible base, and transistors, light-emitting devices and an encapsulation layer that are disposed on the flexible base; and
a surface of the flexible base away from the encapsulation layer is attached to the back film, and a surface of the encapsulation layer away from the flexible base is attached to the protective cover plate.

12. A manufacturing method of a flexible display module, the manufacturing method comprising:
manufacturing a protective cover plate; the protective cover plate including a cover plate body and at least one arc-shaped extension portion, and an end of an arc-shaped extension portion being connected to a side face of the cover plate body; and
attaching the protective cover plate, a flexible display screen and a back film together, so that the protective cover plate is attached to a surface of the flexible display screen, and the back film is attached to another surface of the flexible display screen, an end of the arc-shaped extension portion away from the cover plate body extending beyond an edge of the flexible display screen and an edge of the back film, and an arc-shaped concave surface of the arc-shaped extension portion facing a side face of the flexible display screen and a side face of the back film that are proximate to the arc-shaped extension portion;
wherein manufacturing the protective cover plate, includes:
performing a hot bending treatment on a flat-plate-shaped protective cover plate base, so that a side of the protective cover plate base is formed into the at least one arc-shaped extension portion; and
performing a cooling treatment on the protective cover plate base with the at least one arc-shaped extension portion formed to obtain the protective cover plate.

13. The manufacturing method according to claim 12, wherein the arc-shaped concave surface of the arc-shaped extension portion and the side faces of the flexible display screen and the back film that are proximate to the arc-shaped extension portion have a gap therebetween;
the manufacturing method further comprises:
filling the gap with an elastic material, by using an adhesive dispensing process; and
curing the elastic material.

14. A flexible display apparatus, comprising the flexible display module according to claim 1.

* * * * *